US006960952B2

(12) United States Patent
Nguyen et al.

(10) Patent No.: US 6,960,952 B2
(45) Date of Patent: Nov. 1, 2005

(54) CONFIGURING AND SELECTING A DUTY CYCLE FOR AN OUTPUT DRIVER

(75) Inventors: Huy Nguyen, San Jose, CA (US); Benedict Lau, San Jose, CA (US); Chuen-Huei Chou, San Jose, CA (US)

(73) Assignee: Rambus, Inc., Los Altos, CA (US)

( * ) Notice: Subject to any disclaimer, the term of this patent is extended or adjusted under 35 U.S.C. 154(b) by 0 days.

(21) Appl. No.: 10/661,862

(22) Filed: Sep. 11, 2003

(65) Prior Publication Data

US 2005/0057291 A1 Mar. 17, 2005

(51) Int. Cl.[7] ................................................ H03K 3/017

(52) U.S. Cl. ...................................... 327/175; 327/298

(58) Field of Search ................................ 327/175–177, 327/291, 293, 294, 298, 144–147, 155, 156, 162, 165, 167, 172

(56) References Cited

U.S. PATENT DOCUMENTS

| | | | | | |
|---|---|---|---|---|---|
| 5,477,180 | A | * | 12/1995 | Chen | 327/175 |
| 5,491,440 | A | * | 2/1996 | Uehara et al. | 327/172 |
| 5,614,855 | A | | 3/1997 | Lee et al. | 327/158 |
| 5,757,218 | A | * | 5/1998 | Blum | 327/175 |
| 5,963,071 | A | * | 10/1999 | Dowlatabadi | 327/175 |
| 6,163,178 | A | | 12/2000 | Stark et al. | 327/108 |
| 6,222,354 | B1 | | 4/2001 | Song | 323/275 |
| 6,320,438 | B1 | | 11/2001 | Arcus | 327/175 |
| 6,342,800 | B1 | * | 1/2002 | Stark et al. | 327/170 |
| 6,424,178 | B1 | * | 7/2002 | Harrison | 326/93 |
| 6,426,660 | B1 | * | 7/2002 | Ho et al. | 327/175 |
| 6,518,809 | B1 | * | 2/2003 | Kotra | 327/175 |
| 6,573,779 | B2 | * | 6/2003 | Sidiropoulos et al. | 327/345 |
| 6,788,120 | B1 | * | 9/2004 | Nguyen | 327/172 |
| 2002/0070752 | A1 | | 6/2002 | Harrison | 326/29 |

FOREIGN PATENT DOCUMENTS

| | | | |
|---|---|---|---|
| WO | PCT/US2004/021367 | | 12/2004 |
| WO | WO 2005/027346 | A2 | 3/2005 |

* cited by examiner

*Primary Examiner*—Timothy P. Callahan
*Assistant Examiner*—Hai L. Nguyen
(74) *Attorney, Agent, or Firm*—Morgan, Lewis & Bockius LLP

(57) ABSTRACT

The pre-driver of an output driver is calibrated so as to generate output signals having a specified duty cycle. During calibration, a closed loop is utilized to decrease the differences between the common mode voltage of the output signal and a reference voltage. Calibration data is be stored in registers so that the output driver can be readily configured for one of a plurality of signaling types, each having a respective duty cycle. Additionally, a process, voltage and temperature (PVT) detector can be utilized so that calibration of the pre-driver tracks with process, voltage and temperature variations of the integrated circuit in which the output driver resides.

46 Claims, 5 Drawing Sheets

CONFIGURING AND SELECTING A DUTY CYCLE FOR AN OUTPUT DRIVER

FIELD OF THE INVENTION

The present invention relates generally to electronic circuits, and in particular to systems and methods for configuring and selecting a duty cycle for an output driver.

BACKGROUND OF THE INVENTION

Integrated circuits communicate with each other through electrical signals. As integrated circuits are developed, many different signaling type standards have been defined that specify the expected characteristics of the electric signals. The signaling type typically defines a reference voltage (or level) and duty cycle for the electrical signals. Examples of signaling types are stub-series terminated logic (SSTL), Rambus signaling level (RSL), HSTL, LVDS and DRSL (differential Rambus signaling level).

Integrated circuits (ICs) include, or are connected to, output drivers that generate output signals according to the desired signaling type. Output drivers typically include a pre-driver that ensures the output signal has the correct duty cycle and a driver that ensures the output signal is amplified to the appropriate level.

There are many different factors that can affect the electric signals sent between devices. For example, the packaging methodology for an integrated circuit can affect the electric signals that are sent from the integrated circuit. Therefore, it would be beneficial to be able to tune an output driver to accommodate the packaging methodology that has been utilized. Additionally, it would be beneficial to allow a particular circuit to communicate with a variety of other circuits utilizing different signaling types.

SUMMARY OF THE INVENTION

An integrated circuit includes a closed loop that compares an output signal (e.g., on the pins) of the integrated circuit to a reference voltage for a desired signaling type. One or more registers are utilized to configure a pre-driver to generate a desired duty cycle of the output signal. The integrated circuit can be calibrated for multiple signaling types with multiple registers storing pre-driver configuration data for each signaling type.

In one embodiment, a circuit generates an output signal with a predetermined duty cycle. A driver generates an output signal and a detector determines a common mode voltage of the output signal. A comparator compares the common mode voltage of the output signal to a reference signal that corresponds to a predetermined duty cycle. A register stores a value indicative of a difference between the common mode voltages of the output signal and the reference signal. A pre-driver receives the value stored in the register and sends the output signal to the driver, such that the value stored in the register causes the difference between the common mode voltage of the output signal and the reference signal to decrease.

Other features and advantages of the integrated circuit and method will become readily apparent upon review of the following description in association with the accompanying drawings, where the same or similar structures are designated with the same reference numerals.

DETAILED DESCRIPTION OF EMBODIMENTS

In the description that follows, an output driver circuit will be described with reference to embodiments that configure and select a predetermined duty cycle for the output driver. However, the invention is not limited to any particular environment, signaling type, application, or implementation. For example, the invention may be advantageously applied to any integrated circuit that communicates with other integrated circuits. Therefore, the description of the embodiments that follows is for purposes of illustration and not limitation.

Figure 1:
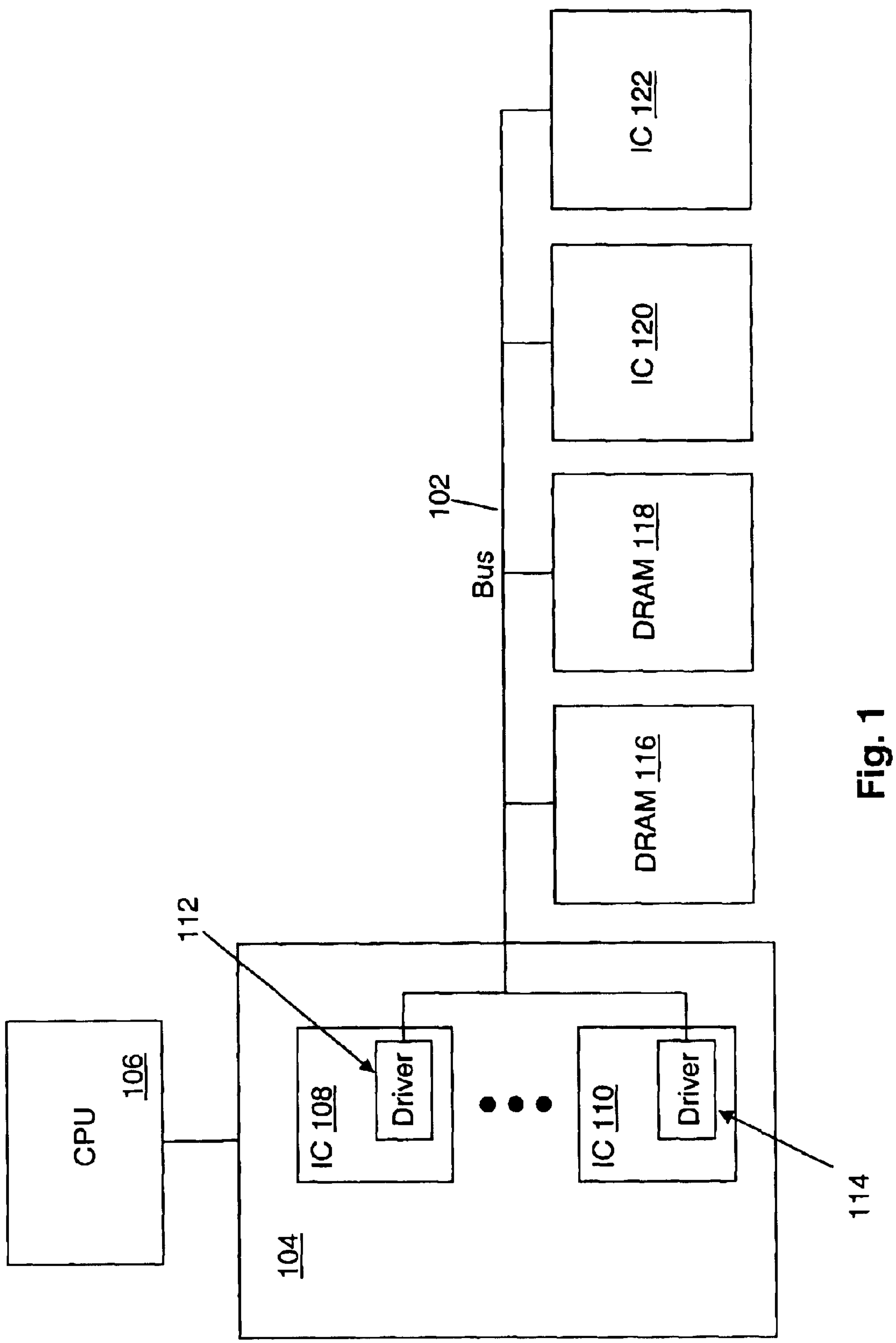
FIG. 1 is a block diagram of a number of integrated circuits in a controller configured to communicate over a bus with one or more other integrated circuits and memory devices using multiple signaling types.

In FIG. 1, a multi-drop bus 102 interconnects a memory controller 104, external memory devices (i.e. Dynamic Random Access Memory (DRAM)) 116, 118, and integrated circuits (ICs) 120, 122. The bus comprises the traces on a printed circuit board, wires, or cables and connectors. The controller 104 is coupled to central processing unit (CPU) 106 to allow a CPU 106 to communicate with memories or other ICs. The controller 104 includes one or more ICs (e.g., 108, 110). Each of the controller ICs 108, 110 has a bus output driver circuit 112, 114, respectively, that interfaces with the bus 102 to drive signals onto the bus and to the DRAMs 116, 118 or ICs 120, 122 connected to the bus.

The bus output drivers 112, 114 of integrated circuits 108, 110, respectively, can be tuned for a specific signaling type. For example, the way in which the die of integrated circuit 108 was packaged can affect the waveform of output signals from the integrated circuit. Wirebond packaging tends to speed up waveforms and C4 (or flipchip) packaging tends to slow down the waveform. Other packaging techniques can affect output signals in the same or different ways. Additionally, channel loading (e.g., socket or termination resistor) and package stresses may skew the transmitted duty cycle.

The output drivers 112, 114 of integrated circuits 108, 110 are configured to automatically tune themselves to compensate for the effects of the circuit's packaging on the output signals and to compensate for the impact of different channel loading characteristics. Additionally, the output driver can be automatically tuned to account for frequency as well as process, voltage and temperature (PVT) factors.

In some embodiments, controller 104 stores values that configure the output drivers for multiple signaling types. Thus, integrated circuits 108, 110 need not be designed for a specific signaling type. This is advantageous because the output drivers 112, 114 can be quickly changed to accommodate for different signaling types. Additionally, integrated circuits 120 and 122, or DRAMs 116, 118, may be configured to receive signals of a specified signaling type that is one of a number of predefined signaling types. In such a situation, integrated circuit 108 initially sends signals through bus 102 to ascertain the expected signaling type of the attached devices. Then, integrated circuit 108 configures its output driver 112 to use the appropriate signaling type for the receiving device. The controller 104 may also send messages to the other devices on the bus 102 to instruct them to use a particular signaling type.

Memory devices and other types of integrated circuits may be designed or configured to use a particular signaling type to maximize performance of that device or circuit. Controller 104 includes an output driver that configures itself to a specific signaling type or configures itself to one of multiple signaling types utilizing stored calibrated data. In this manner, flexibility is achieved in the types of memories or other integrated circuits that can be utilized by CPU 106.

Figure 2:
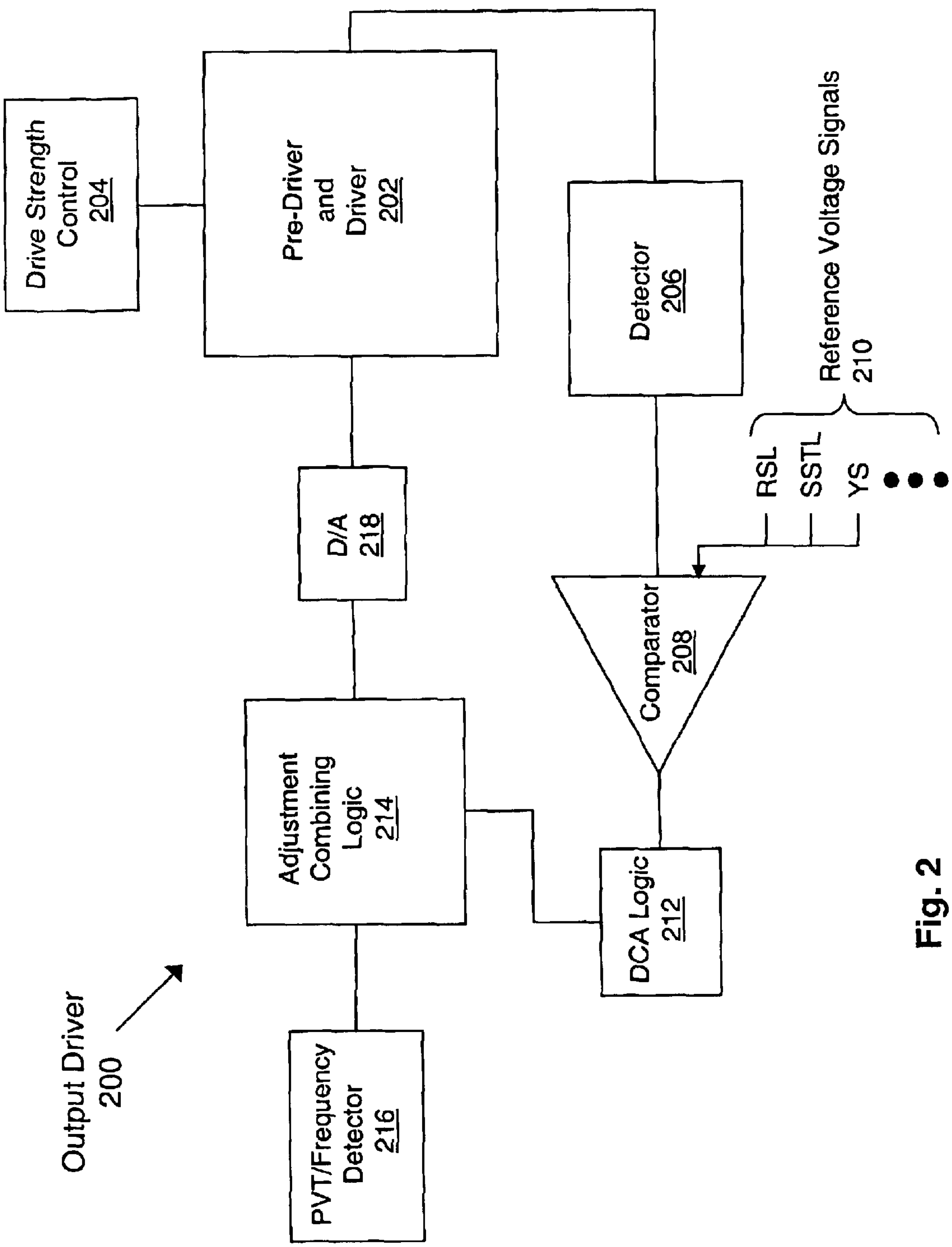
FIG. 2 is a block diagram of a circuit that uses a closed loop to configure a pre-driver to a predetermined duty cycle.

As mentioned above, the output driver can store calibrated data for one or more signaling types. FIG. 2 shows a block diagram of an output driver 200 that configures itself to a signaling type and stores calibrated data. A pre-driver/driver 202 generates an output signal having a drive strength set by drive strength control 204. Such drive strength controls are discussed, for example, in U.S. Pat. No. 6,163,178, issued Dec. 19, 2000, to Donald C. Stark et al., which is hereby incorporated by reference.

During calibration, a closed loop is formed in order to calibrate the pre-driver/driver 202 for a specific signaling type. Pre-driver/driver 202 generates an output signal that is received by a detector 206, such as a common mode detector or integrated sampler. In some embodiments, the detector 206 is on the same integrated chip as the pre-driver/driver 202 such that the closed loop is maintained on the same integrated chip. The output signal from the driver 202 may be a binary signal or other type of data signal having a balanced pattern (such as "1001" or "1010"), having a substantially equal number of 1's and 0's (or other symbols) on average. Detector 206 determines an average or common mode voltage of the output signal. The common mode voltage of the output signal is then received by a comparator 208.

Comparator 208 also receives a reference voltage signal 210 that is to be compared to the signal from the detector 206. The reference voltage signal 210 is typically the reference voltage for a signaling type (e.g., RSL, HSTL, LVDS, DRSL, etc.) and is also used by drive strength control 204. Comparator 208 compares the common mode voltage of the output signal and the voltage of the reference voltage signal 210 in order to determine the skew between the two signals. Comparator 208 typically outputs a signal that is based on the difference between the voltage of the reference signal and the common mode voltage of the output signal. The comparator 208 sends an output signal to DCA (duty cycle adjustment) logic 212. In an embodiment described below, DCA logic 212 includes a counter. (See counter 310 in FIG. 3.) DCA logic 212 produces a value, (hereinafter the "skew value") that is used to configure output pre-driver/driver 202 so as to decrease the difference, if any, between the common mode voltage of the output signal and the reference signal. In some embodiments, the skew value produced by DCA logic 212 is adjusted (e.g., increased or decreased) over a plurality (e.g., five to sixteen) calibration cycles, with the adjustment made during each calibration cycle to successively reducing the difference, if any, between the common mode voltage of the output signal and the reference signal.

Adjustment combining logic 214 receives the skew value produced by the DCA logic 212. Logic 214 also receives a signal from PVT/frequency detector 216 that indicates an adjustment value associated with the process, voltage, temperature and frequency of the integrated circuit or device in which the output driver is located. Logic 214 may include one or more registers to store one or more skew values (received from the DCA logic 212) that configures output pre-driver/driver 202 to a predetermined signaling type. Alternately, separate registers (not shown) may be coupled to logic 214 to store skew values. Regardless of the location of the registers, at least one register is used to store the skew value from DCA logic 212. The skew value may be combined with a value from the PVT detector 216 to produce a combined skew value. By receiving a value from a PVT detector 216, output driver 200 is calibrated for process, voltage, temperature and often frequency variations. As multiple values may be combined in order to configure the output driver 200, adjustment combining logic 214 includes logic to combine the various skew values and PVT modification values so as to produce a combined skew value. In an embodiment described below, adjustment combining logic 214 includes an arithmetic logic unit (ALU). (See ALU 316 in FIG. 3.) In another embodiment, the adjustment combining logic 214 includes an adder and logic for directing the combined skew value to one of two skew control ports of the pre-driver/driver 202, depending on the sign of the skew value.

In one embodiment, PVT detector 216 is implemented as a delay lock loop (DLL). The DLL can provide PVT detection and also operating frequency tracking. Thus, PVT detector 216 can also be a frequency detector such that the value (or values) from PVT detector 216 configures the pre-driver/driver 202 to track the operating frequency of the system. In alternate embodiments, a frequency detector could be utilized with or without a PVT detector.

In some embodiments, the combined skew value from adjustment combining logic 214 (or a register storing the result of the logic operations in logic 214) is converted into an analog signal by an digital-to-analog (D/A) converter 218. The analog signal from D/A converter 218 configures pre-driver/driver 202 to generate an output signal that is better calibrated to the duty cycle of the signaling type than the signal initially produced by the pre-driver/driver 202. In other embodiments, the combined skew value or signal produced by the adjustment combining logic 214 is used directly by the pre-driver/driver 202 to adjust the output signals it generates. By iteratively using this calibration process, output driver 202 is quickly calibrated for a specific signaling type (e.g., with a predetermined duty cycle).

Figure 3:
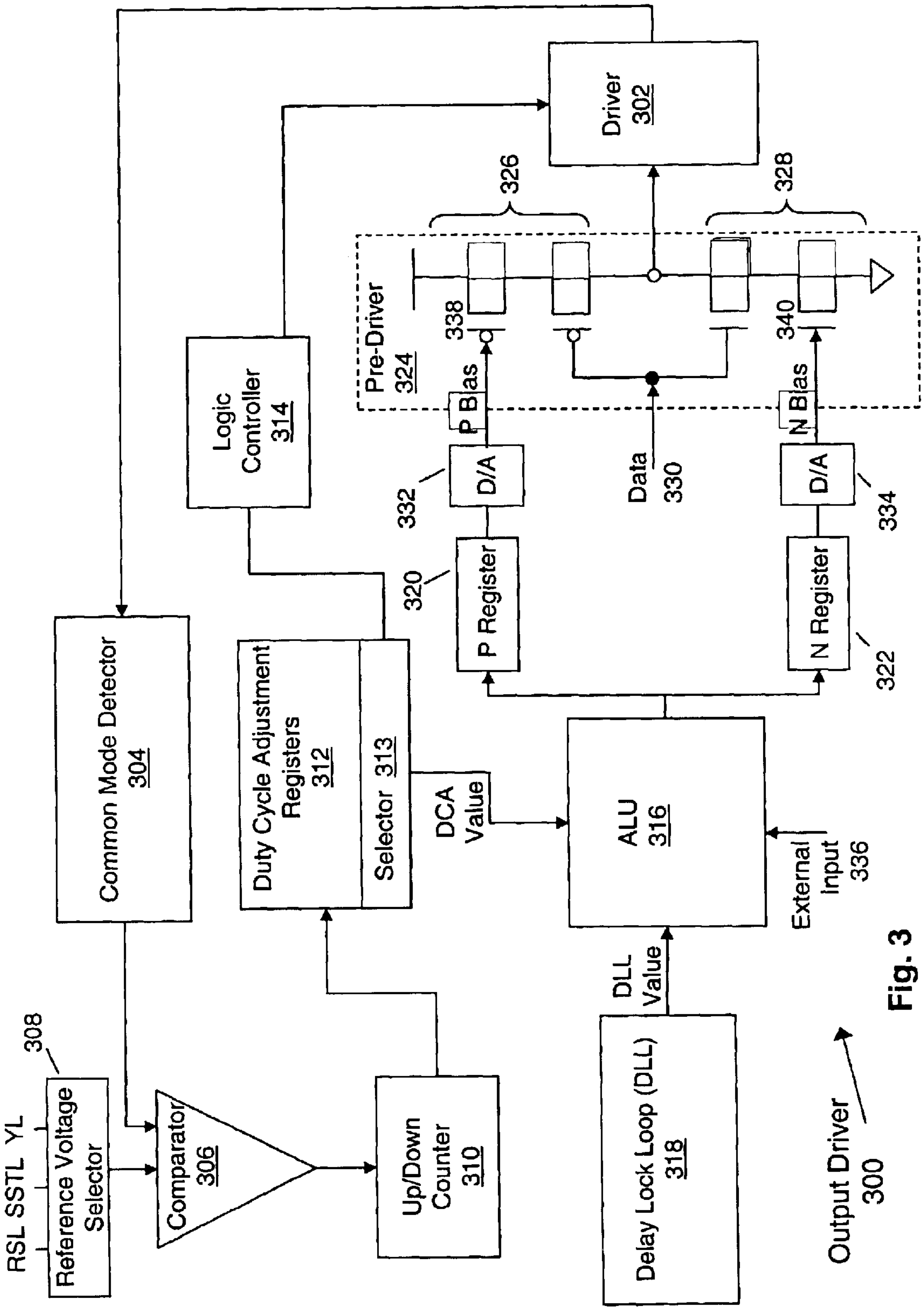
FIG. 3 is a schematic diagram of a circuit that can be calibrated for multiple signaling types, and that is tuned so as to compensate for process, voltage, temperature and/or frequency variations.

FIG. 3 shows an output driver 300 that is an embodiment of the output driver 200 discussed above. Output driver 300 includes a driver 302 that generates an output signal based on a data signal received by the output driver at data node 330. During calibration, the data signal is typically a clock signal having a symmetrical, duty-cycle-balanced signal (e.g., 1001 or 1010). The output signal is received by a common mode detector 304. Common mode detector 304 determines the common mode voltage of the output signal, which is received by a comparator 306. As mentioned above, the output signal is typically a symmetric pattern during calibration.

Comparator 306 compares the common mode voltage of the output signal to the common mode voltage of a reference signal. As shown, there may be multiple reference voltages and the appropriate reference voltage is selected by the reference voltage selector 308 for the desired signaling type. In some embodiments, the reference voltage may be provided to the comparator 306 from an external source.

An up/down counter 310 receives a signal from comparator 306 that increments or decrements the counter according to how the common mode voltage of the output signal compares to the reference signal voltage. For example, if the common mode voltage of the output signal is higher than the reference signal voltage, up/down counter 310 is incremented. If the common mode voltage of the output signal is lower than the reference signal voltage, up/down counter 310 is decremented. In some embodiments, the up/down counter operates in the opposite manner.

In some embodiments, duty cycle registers 312 store calibration data for multiple signaling types or devices. Each respective register stores the value produced by counter 310 during calibration for a respective signaling type. The duty cycle registers 312 include a selector 313, for selecting and outputting the value from a selected one of the registers. The selector 313 may be decoder (e.g., if the registers 312 are stored in a memory array) or a multiplexer, or the like, and is responsive to a selection signal received from the logic controller 314. In some other embodiments, which are calibrated for only a single signaling type, the duty cycle registers 312 are replaced by an output register of the counter 310.

An ALU 316 receives the duty cycle adjustment value (sometimes herein called the DCA value or skew value) stored in the register for the selected signaling type and/or the selected device. ALU 316 combines the DCA value from the selected register with values (or codes) from a Delay Lock Loop (DLL) 318. DLL 318 functions as a PVT detector in this embodiment, and may also function as a frequency detector. By utilizing digital values from DLL 318 (i.e., DLL values), PVT and/or operating frequency variations are compensated for in setting the pre-driver 324 to change the duty cycle of the output driver 302. Further details of one embodiment of DLL 318 are described below.

In this embodiment, the combined values are separated into a value for a P register 320 and N register 322. As will be described below, P register 320 affects a P bias transistor within a PMOS pull-up circuit 326 in the pre-driver 324. N register 322 affects an N bias transistor within a NMOS pull-down circuit 328 in the pre-driver 324. Although, two configuring transistors are shown, other embodiments can utilize fewer or more transistors, or different types of transistors.

ALU 316 combines DLL values with DCA values according to one or more pre-defined functions. The pre-defined functions in the ALU 316 take the general form:

$$P=Fn\mathbf{1}(DCA\text{ value, }DLL\text{ value}); \quad (1)$$

$$N=Fn\mathbf{2}(DCA\text{ value, }DLL\text{ value}). \quad (2)$$

P is the value to be stored in the P register 320, N is the value to be stored in the N register 322, and Fn1 and Fn2 are mathematical functions and/or logic functions of the DCA value and the DLL value. Fn1 and Fn2 may be the same or different functions. Either Fn1 or Fn2 may include a function that adds or subtracts the DLL value and the DCA value. Alternately, Fn1 and Fn2 may include constants to be added to or subtracted from either or both the DLL value and the DCA value, and/or Fn1 and Fn2 may include scaling factors for multiplying or dividing either or both the DLL value and the DCA value.

In some embodiments, only one of the two registers (i.e., either the P register or the N register) is changed in response to the combined skew value generated by the ALU 316, while the other is set to a predefined nominal value. For example, the N register 322 may be held constant (at a predefined nominal value) and the P Register 320 changed such that only the P bias transistor within the PMOS pull-up circuit 326 is altered to affect the pre-driver duty cycle in response to changing values from the ALU 316. For example, if the register selected in the duty cycle registers 312 holds a negative value from the up/down counter 310 (i.e., indicating that the duty cycle of the output signal is less than the target duty cycle corresponding to the reference signal voltage) and the DLL value is zero, then the combined value may be stored in the P register to pull-up the PMOS circuit 326 the pre-driver 324 in a manner that increases the duty cycle of the output signal produced by the driver 302.

A digital-to-analog (D/A) converter 332, 334 converts values from P register 320 and N register 322, respectively, into analog signals. These analog signals are then applied to gates of a P bias transistor 338 and a N bias transistor 340 in a pre-driver 324. The values applied to the transistors in pre-driver 324 adjust the slew rate so that the duty cycle of the desired signaling type is matched by the driver output signal. Driver 302 receives a signal from pre-driver 324 and generates the output signal. Thus, in this embodiment analog voltages are utilized to change the duty cycle of the output driver by configuring the pre-driver 324. In an alternate embodiment, the D/A converter 332 and P bias transistor 338 may be replaced by a set of binary-weighted parallel bias transistors to control the pull up current of the pre-driver 324 and to thereby alter the slew rate and duty cycle of the output driver. Similarly, the D/A converter 334 and N bias transistor 340 may be replaced by a set of binary-weighted parallel bias transistors to control the pull down current of the pre-driver 324 and to thereby alter the slew rate and duty cycle of the output driver.

As the output driver is calibrated for a specific signaling type, the output signal is processed through a closed loop. In each iteration through the loop, the value stored in the appropriate register in duty cycle registers 312 is updated so that pre-driver 324 will be configured to decrease the difference between the common mode voltage of the output signal and the reference signal voltage. An advantage of the embodiment shown in FIG. 3 is that DLL values from DLL 318 are taken into account during calibration.

In some embodiments, the output driver also includes external inputs 336 that allow a user to "manually" or directly enter a value or values to configure the output driver. This enables the user to optimize the driver duty cycle for loading/termination characteristics. This also supports margin testing by enabling manual skewing of the output driver duty cycle. Although external inputs 336 in an alternate embodiment (not shown) may be applied directly to pre-driver 324, it is advantageous to preserve the values from duty cycle registers 312 and DLL 318 even when using values entered via external inputs 336. In some embodiments, values entered via external inputs 336 are combined in the ALU 316 with values from duty cycle registers 312 and DLL 318 to produce values or bias signals that are conveyed to the pre-driver 324. In other embodiments, external inputs 324 override the combined values generated by the ALU 316 from the values in the duty cycle registers 312 and DLL 318. In yet other embodiments, the external inputs are used to overwrite the values stored in one or more of the duty cycle registers 312.

Returning now to DLL 318, the DLL is an embodiment of a PVT detector. It is understood that a PVT detector may be implemented in a number of ways. In the embodiment illustrated in FIG. 3, the DLL 318 includes a DLL control and multiple delay cells or mixers (not shown). Each of the delay cells are typically configured to be out of phase by 45° relative to each other. Signals from delay cells are received by a phase detector (not shown) which in turn completes the loop to the DLL control. A specific implementation of a DLL PVT detector can be found in U.S. Pat. No. 5,614,855, issued Mar. 25, 1997 to Thomas H. Lee et al., which is hereby incorporated by reference.

The DLL codes are the digital-to-analog conversion (DAC) codes that control the current feeding the delay cells to change the delay value in order to ensure that the DLL will track the operating frequency. The extracted DAC codes are distributed to other components (e.g., the pre-driver) because they carry information about the process variation, operating voltage, temperature, and relative operating frequency of the integrated circuit in which the DLL 318 resides.

In the embodiment shown in FIG. 3, for example, it may be advantageous to use RC type delay cells in the DLL 318. The resistor element of these delay cells is typically a PMOS device used as a load resistor, which matches the behavior of the dominant PMOS device of pre-driver 324, which uses its impedance to limit the pre-driver current. In embodiments where the delay cells of the DLL 318 and the bias transistors of the pre-driver 324 use a similar gate voltage biasing scheme, the tracking of these two circuits over process, voltage and temperature is well maintained. Additionally, the capacitor elements (i.e., C) of the DLL's delay cells are typically N type capacitors, which match the gate-drain capacitor loading the N bias transistor of pre-driver 324. The similarity of these N type devices maintains tracking over process, voltage and temperature.

Figure 4:
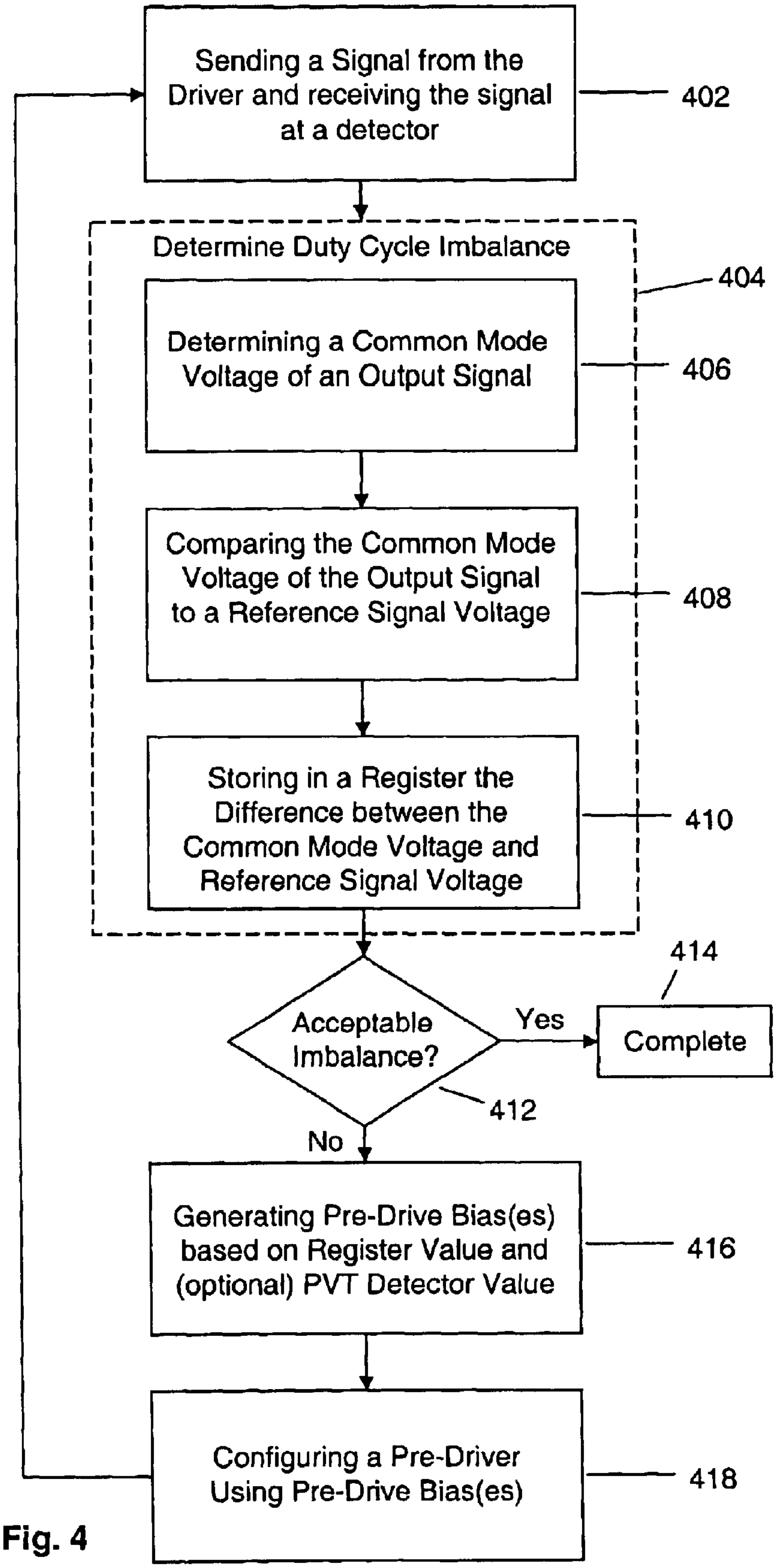
FIG. 4 is a flowchart of an iterative process to configure a pre-driver to produce a signal having a duty cycle corresponding to a reference signal.

FIG. 4 shows a flowchart of a process of generating an output signal with a predetermined duty cycle. As with all flowcharts herein, steps may be added, deleted, combined and reordered without departing from the spirit and scope of the invention. The control aspects of the process shown in FIG. 4 are implemented primarily by the logic controller 314. In some embodiments, the logic controller 314 includes a processor and program instructions for performing the control aspects of the process, while in other embodiments the logic controller 314 includes a state machine for performing the control aspects of the process.

At step 402, an output driver generates an output signal having a duty cycle determined by a pre-driver having an initial configuration. The output signal is received at a detector.

Boxed area 404 includes steps for determining a duty cycle imbalance between a common mode voltage of an output signal from the output driver and a reference signal voltage. At step 406, a common mode voltage of an output signal is determined. The common mode voltage of the output signal is compared to the voltage of the reference signal at a step 408. In other embodiments, the common mode voltage and reference signal voltage may be replaced by other signals that represent the output signal and the reference signal in a manner that allows the duty cycle of the output signal to be evaluated.

At a step 410, a value indicative of a difference between the common mode voltage of the output signal and the reference signal voltage is stored in a register. In some embodiments as described previously, multiple registers can be utilized to store values for multiple signaling types and/or receiving devices. If it is determined at step 412 that the duty cycle imbalance determined in the steps within box 404 is acceptable, the process flow is considered complete 414. The duty cycle imbalance may be determined to be acceptable when the difference between the common mode voltages of the output signal and the reference signal is below a threshold, a specified number of calibration cycles have been performed, a specified period of time has expired, or the like.

If the duty cycle imbalance is determined not to be acceptable at step 412, one or more pre-driver biases are generated at step 416 based on the register value of step 410. In some embodiments, the pre-drive biases are also based on a PVT detector value which indicates changes in process, voltage and/or temperature within the system. By utilizing a PVT detector as a frequency detector as described previously, the output signal can also track the operating frequency of the circuit in which the output driver resides. For example, a faster slew rate may be used with a higher operating frequency and a slower slew rate may be used with a lower operating frequency.

The pre-driver is configured at step 418 according to the pre-drive bias(es) generated at step 416. The pre-drive bias(es) generated at step 416 will, in most circumstances, cause a decrease in the difference between the common mode voltage of the output signal and the common mode voltage of the reference signal.

As described previously, the process of FIG. 4 is typically an iterative process. Thus, if the duty cycle imbalance is determined to be unacceptable at step 412, then after step 418 the calibration process is re-started at step 402 with the driver sending a signal having a duty cycle set by the pre-driver. At this point, the pre-driver has been configured using the pre-drive biases generated in step 416. By repeating the calibration process (steps 402 through 418), one or more pre-drive biases are iteratively changed to reduce the duty cycle imbalance until the imbalance is determined to be at an acceptable level at step 412.

Figure 5:
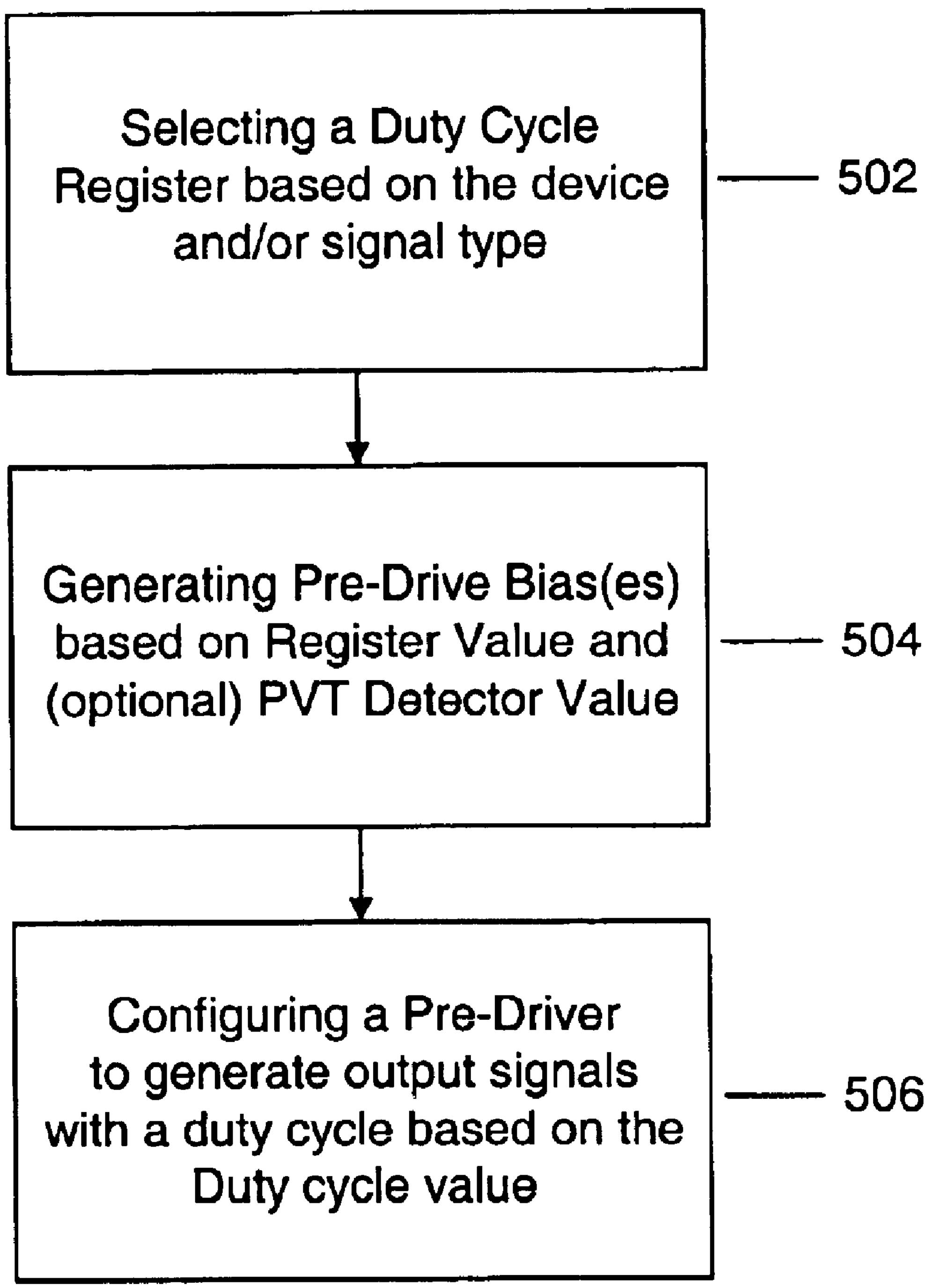
FIG. 5 is a flowchart of a process for generating an output signal by selecting one of multiple registers that store values for configuring a pre-driver.

In some embodiments, multiple registers are utilized to store values for configuring a pre-driver for various duty cycles. FIG. 5 shows a flowchart of a process of generating an output signal for one of multiple signaling types.

At a step 502, one of multiple registers is selected. Each register stores a value that configures a pre-driver to generate an output signal with a duty cycle of one of multiple signaling types. The register can also contain a device identifier (or device characteristics) so that the device identifier can be correlated to the device or circuit that receives the signals. In this way, the pre-driver can be configured to generate a duty cycle that matches the receiving device's duty cycle characteristics.

One or more pre-drive biases are generated at step 504 based on the selected register value. In some embodiments, the pre-drive biases are also based on a PVT detector value to take into account process, voltage and temperature, and possibly operating frequency variations as well in the system or device in which the output driver resides.

At step 506, the pre-driver is configured using the pre-drive bias(es) such that the output driver generates an output signal with the duty cycle of the selected signaling type or device. The values in the multiple registers can be set according to any of the calibration techniques that are described above.

Advantages of the embodiments described above include a closed loop self-calibration technique to optimize output duty cycle for a single die to be packaged in different package types and to adapt to different channel loading characteristics. Additionally, closed loop self-calibration optimizing output duty cycle that is adaptive for many different signaling types. Also, operating frequency tracking is realized and PVT detector information is utilized by the pre-driver for improved performance (even when using manual inputs). Post packaging manipulation of the pre-driver to skew or correct the transmitted duty cycle can also be achieved.

The present invention encompasses appropriate modifications to the embodiments described above. For example, although the PVT detector has been described in some embodiments as a DLL, embodiments of the invention can utilize other types of PVT detectors. The scope of the invention is defined by the appended claims and is not limited to the embodiments described above.

What is claimed is:

1. A circuit for generating an output signal with a predetermined duty cycle, comprising:

a driver that generates an output signals;

a detector coupled to the driver, to determine a common mode voltage of the output signal;

a comparator coupled to the detector, to compare the common mode voltage of the output signal to a reference voltage for a predetermined duty cycle;

a register coupled to the comparator, to store a value indicative of a difference between the common mode voltage of the output signal and the reference voltage;

adjustment combining logic to combine a second value and the value stored in the register to produce an adjusted value; and a pre-driver to receive a signal corresponding to the adjusted value and to send a data signal corresponding to the output signal to the driver, wherein the value stored in the register causes the common mode voltage of the output signal to change so as to decrease the difference between the common mode voltage of the output signal and the reference voltage.

2. The circuit of claim 1, wherein the common mode voltage of the output signal becomes substantially equal to the reference voltage through a plurality of iterations through a closed loop.

3. The circuit of claim 1, wherein the duty cycle of the generated output signal takes into account variations due to packaging.

4. The circuit of claim 1, wherein the output signal is a symmetric pattern.

5. The circuit of claim 1, further comprising a counter coupled between the comparator and the register.

6. The circuit of claim 1, further comprising a digital-to-analog converter coupled between the register and the pre-driver.

7. The circuit of claim 6, wherein an analog voltage from the digital-to-analog converter configures the pre-driver.

8. The circuit of claim 6, wherein an output of the digital-to-analog converter is coupled to a gate of a transistor of the pre-driver.

9. The circuit of claim 1, further comprising:

a first digital-to-analog converter coupled between the register and the pre-driver, wherein an output of the first digital-to-analog converter is coupled to a first gate of a first transistor of the pre-driver; and a second register coupled to the comparator to store a value indicative of a difference between the common mode voltage of the output signal and the reference voltage; and a second digital-to-analog converter coupled between the second register and the pre-driver, wherein an output of the second digital-to-analog converter is coupled to a second gate of a second transistor of the pre-driver.

10. The circuit of claim 1, further comprising a plurality of registers coupled to the comparator, each of the registers configured to store a value that configures the pre-driver to generate an output signal for a respective duty cycle of respective one of a plurality of signal types.

11. The circuit of claim 1, further comprising an input to receive an externally provided value, the externally provided value comprising the second value.

12. The circuit of claim 1, further comprising a process/voltage/temperature (PVT) detector to produce a signal corresponding to the second value.

13. The circuit of claim 12, wherein the signal produced by the PVT detector is a digital code.

14. The circuit of claim 12, wherein the PVT detector comprises a delay lock loop (DLL).

15. The circuit of claim 12, wherein the PVT detector includes a frequency detector to track operating frequency.

16. The circuit of claim 12, further comprising an input to receive an externally provided value, wherein the adjustment combining logic is configured to combine the externally provided value, the second value and the value stored in the register to produce the adjusted value; and wherein the signal received by the pre-driver corresponds to the adjusted value.

17. The circuit of claim 1, further comprising a frequency detector to track operating frequency to produce a signal corresponding to the second value.

18. A method of generating an output signal with a predetermined duty cycle, comprising:

determining a common mode voltage of an output signal;

comparing the common mode voltage of the output signal to a reference voltage for a predetermined duty cycle;

storing in a register a value indicative of a difference between the common mode voltage of the output signal and the reference voltage;

combining a second value and the value stored in the register to produce an adjusted value; and re-configuring a pre-driver, used in generating the output signal, in accordance with the adjusted value so as to cause a decrease in the difference between the common mode voltage of the output signal and the reference voltage.

19. The method of claim 18, further comprising repeating the determining, comparing, storing, combining and re-configuring through a plurality of iterations.

20. The method of claim 18, wherein re-configuring comprises:

converting of the adjusted value from a digital value to an analog signal; and applying the analog signal to a gate of a transistor of the pre-driver.

21. The method of claim 18, further comprising selecting a register from a plurality of registers, each register storing a value suitable for configuring the pre-driver to generate an output signal with a duty cycle of one of a plurality of signaling types.

22. The method of claim 18, wherein the second value is an externally provided value.

23. The method of claim 18, wherein the second value is a value obtained from a process/voltage/temperature (PVT) detector.

24. The method of claim 23, further including combining the value stored in the register with the value obtained from a process/voltage/temperature (PVT) detector and an externally provided value to produce the combined value.

25. The method of claim 18, wherein the second value is a value obtained from a frequency detector.

26. A system, comprising:

a first circuit to receive signals of a specific signaling type, the specific signaling type having a predetermined duty cycle; and a second circuit coupled to the first circuit, the second circuit comprising:

a pre-driver;

a plurality of registers coupled to the pre-driver, each register to store a value suitable for configuring the pre-driver to generate an output signal with a duty cycle of one of a plurality of signaling types, wherein the specific signaling type is one of the plurality of signaling types; and a selector, coupled to the plurality of registers, to select one of the plurality of registers so as to output the value stored in the selected register;

wherein the pre-driver is configured in accordance with the output value from the selected register so as to generate an output signal with the predetermined duty cycle and send the output signal to the first circuit.

27. The system of claim 26, wherein the second circuit further comprises:

a driver coupled to the pre-driver, to generate the output signal;

a detector coupled to the driver, to determine a common mode voltage of the output signal;

a comparator coupled to the detector to compare the common mode voltage of the output signal to a reference voltage for the duty cycle of selected signaling type of the plurality of signaling types; and the plurality of registers coupled to the comparator, each respective register of the plurality of registers storing a value indicative of a difference between the common mode voltage of the output signal and a respective reference voltage for the duty cycle of a respective one of the plurality of signaling types.

28. The system of claim 27, further comprising a counter coupled between the comparator and the plurality of registers.

29. The system of claim 26, further comprising a digital-to-analog converter coupled between the plurality of registers and the pre-driver.

30. The system of claim 29, wherein an analog signal from the digital-to-analog converter configures the pre-driver.

31. The system of claim 29, wherein an analog signal from the digital-to-analog converter is coupled to a gate of a transistor of the pre-driver.

32. The system of claim 26, further comprising an input to receive an externally provided value and adjustment combining logic to combine the externally provided value and a value stored in the selected register to produce an adjusted value; wherein the pre-driver is configured in accordance with the adjusted value.

33. The system of claim 26, further comprising a process/voltage/temperature (PVT) detector, and adjustment combining logic to combine a value from the PVT detector and a value stored in the selected register to produce an adjusted value; wherein the pre-driver is configured in accordance with the adjusted value.

34. The system of claim 33, wherein the value from the PVT detector is a digital code.

35. The system of claim 33, wherein the PVT detector comprises a delay lock loop (DLL).

36. The system of claim 33, wherein the PVT detector includes a frequency detector to track operating frequency.

37. The system of claim 33, further comprising an input to receive externally provided values for storage in the plurality of registers.

38. The system of claim 26, further comprising a frequency detector to track operating frequency, and adjustment combining logic to combine a value from the frequency detector and the value stored in the selected register to produce an adjusted value; wherein the pre-driver is configured in accordance with the adjusted value.

39. A method of generating an output signal for one of a plurality of signaling types, comprising:

selecting one of a plurality of registers, each respective register storing a value suitable for configuring a pre-driver to generate an output signal with a duty cycle of a respective signaling type of the plurality of signaling types; and configuring the pre-driver according to the selected register, the pre-driver generating an output signal with a duty cycle corresponding to the value stored in the selected register.

40. The method of claim 39, including receiving input specifying the selected register or specifying the signaling type corresponding to the value stored in the selected register.

41. The method of claim 39, wherein configuring comprises:

converting of the value in the register from a digital value to an analog signal; and applying the analog signal to a gate of a transistor of the pre-driver.

42. The method of claim 39, further comprising receiving an externally provided value, combining the value stored in the selected register with the externally provided value to produce an adjusted value, and configuring the pre-driver in accordance with the adjusted value.

43. The method of claim 39, further including combining the value stored in the selected register with a value obtained from a process/voltage/temperature (PVT) detector to produce a combined value, and configuring the pre-driver in accordance with the combined value.

44. The method of claim 43, including combining the value stored in the register with the value obtained from the process/voltage/temperature (PVT) detector and an externally provided value to produce a combined value, and configuring the pre-driver in accordance with the combined value.

45. The method of claim 43, wherein the PVT detector includes a frequency detector and the value obtained from the PVT detector tracks an operating frequency.

46. The method of claim 39, further including combining the value stored in the selected register with a value obtained from a frequency detector to produce a combined value that tracks an operating frequency, and configuring the pre-driver in accordance with the combined value.

* * * * *

UNITED STATES PATENT AND TRADEMARK OFFICE

CERTIFICATE OF CORRECTION

PATENT NO. : 6,960,952 B2
DATED : November 1, 2005
INVENTOR(S) : Huy Nguyen et al.

It is certified that error appears in the above-identified patent and that said Letters Patent is hereby corrected as shown below:

Column 9,
Line 15, replace "signals" with -- signal --;
Line 18, delete "," after "detector";
Line 20, delete "," after "comparator";

Column 11,
Line 24, delete "," after "pre-driver";
Line 26, delete "," after "driver".

Signed and Sealed this

Third Day of January, 2006

JON W. DUDAS
*Director of the United States Patent and Trademark Office*